US012593402B2

(12) United States Patent (10) Patent No.: US 12,593,402 B2
Ren et al. (45) Date of Patent: Mar. 31, 2026

(54) ELECTRONIC DEVICE

(71) Applicant: BEIJING DREAM INK TECHNOLOGIES CO., LTD., Beijing (CN)

(72) Inventors: Zhongwei Ren, Beijing (CN); Jiangchuan Wang, Beijing (CN); Jiameng Kang, Beijing (CN)

(73) Assignee: BEIJING DREAM INK TECHNOLOGIES CO., LTD., Beijing (CN)

( * ) Notice: Subject to any disclaimer, the term of this patent is extended or adjusted under 35 U.S.C. 154(b) by 109 days.

(21) Appl. No.: 17/995,477

(22) PCT Filed: Mar. 1, 2022

(86) PCT No.: PCT/CN2022/078566
§ 371 (c)(1),
(2) Date: Oct. 4, 2022

(87) PCT Pub. No.: WO2022/227839
PCT Pub. Date: Nov. 3, 2022

(65) Prior Publication Data
US 2024/0244745 A1 Jul. 18, 2024

(30) Foreign Application Priority Data
Apr. 28, 2021 (CN) .......................... 202110470063.3

(51) Int. Cl.
*H05K 1/09* (2006.01)
*H01B 1/20* (2006.01)
(Continued)

(52) U.S. Cl.
CPC ............. *H05K 1/092* (2013.01); *H05K 1/095* (2013.01); *H01B 1/20* (2013.01); *H01B 1/22* (2013.01);
(Continued)

(58) Field of Classification Search
CPC ........ H05K 1/092; H05K 1/095; H05K 3/227; H05K 2203/0766; H01B 1/20; H01B 1/22
See application file for complete search history.

(56) References Cited

U.S. PATENT DOCUMENTS

| | | | | |
|---|---|---|---|---|
| 4,416,932 A | * | 11/1983 | Nair ....................... | H05K 1/092 |
| | | | | 427/63 |
| 2001/0021547 A1 | * | 9/2001 | Sakairi ................... | H05K 3/323 |
| | | | | 438/200 |

(Continued)

FOREIGN PATENT DOCUMENTS

| | | |
|---|---|---|
| CN | 104851523 A | 8/2015 |
| CN | 109887646 A | 6/2019 |

(Continued)

OTHER PUBLICATIONS

Mach et al, "Usability of electrically conductive adhesives for power components assembly," 2010 IEEE 16th International Symposium for Design and Technology in Electronic Packaging (SIITME), Pitesti, Romania, 2010, pp. 301-304. (Year: 2010).*

(Continued)

*Primary Examiner* — A. Dexter Tugbang
(74) *Attorney, Agent, or Firm* — McCoy Russell LLP

(57) ABSTRACT

Provided is an electronic device. The electronic device includes a substrate and a conductive structure disposed on the substrate, the conductive structure includes a conductive pattern made of a conductive paste and positive ions, the conductive pattern includes conductive particles and a resin, and the positive ions are attached to the resin among the conductive particles. The conductive structure is divided into a plurality of areas in a first direction, and a number of the positive ions in adjacent areas of the conductive structure along the first direction is gradually increased or decreased, in such a manner that the conductive structure is a step resistor.

3 Claims, 4 Drawing Sheets

(51) Int. Cl.
    *H01B 1/22*         (2006.01)
    *H05K 3/22*         (2006.01)

(52) U.S. Cl.
    CPC ..... *H05K 3/227* (2013.01); *H05K 2203/0766*
        (2013.01)

(56)            References Cited

U.S. PATENT DOCUMENTS

| | | | |
|---|---|---|---|
| 2009/0032779 A1* | 2/2009 | Toyoda .................. | H05K 1/092 |
| | | | 523/160 |
| 2015/0153478 A1* | 6/2015 | Takeda ..................... | H01B 1/20 |
| | | | 427/126.3 |

FOREIGN PATENT DOCUMENTS

| | | | |
|---|---|---|---|
| CN | 112002458 A | | 11/2020 |
| CN | 113192665 A | | 7/2021 |
| JP | 2011249036 A | | 12/2011 |
| JP | 2016062653 A | | 4/2016 |
| JP | 2017105911 A | * | 6/2017 |
| WO | 2020202969 A1 | | 10/2020 |

OTHER PUBLICATIONS

State Intellectual Property Office of the People's Republic of China, Office Action and Search Report Issued in Application No. 202110470063.3, May 17, 2022, 10 pages. (Submitted with Partial Translation).

\* cited by examiner

ELECTRONIC DEVICE

CROSS REFERENCE TO RELATED APPLICATIONS

The present application is a U.S. National Phase of International Application No. PCT/CN2022/078566, entitled "ELECTRONIC DEVICE AND MANUFACTURING METHOD THEREOF," and filed on Mar. 1, 2022. International Application No. PCT/CN2022/078566 claims priority to Chinese Patent Application No. 202110470063.3 filed on Apr. 28, 2021. The entire contents of each of the above-listed applications are hereby incorporated herein by reference for all purposes.

TECHNICAL FIELD

The present disclosure relates to the field of electronic manufacturing technology, and more particularly to an electronic device and a manufacturing method thereof.

BACKGROUND

Conventional conductive pastes mainly include conductive fillers, binders and various conditioning aids mixed to form a composite system, including high temperature conductive pastes, in which the binders are mainly inorganic binders, for ceramic, component, energy applications, and low temperature conductive pastes, in which the binders are mainly organic binders, for film, sheet or fabric substrates under low temperature conditions. For low temperature conductive pastes, a typical application process is to form a pattern on a substrate by printing, spraying, or transferring, and dry cure at a temperature ranging from 150° C. to 300° C. for curing to form a conductive wiring where an organic binder will remain in the conductive wiring. The resistance of the conductive wiring depends not only on the formulation of the low temperature conductive paste, but also on the temperature and time of the drying and curing process, which may limit the application of the low temperature conductive paste.

SUMMARY

The present disclosure provides an electronic device and a method of making the same, which can cure the resistance of a conductive structure without changing the current conductive paste material system.

In a first aspect, the present disclosure provides an electronic device adopting the following technical solutions:

The electronic device comprises:

a substrate and a conductive structure provided on the substrate, wherein the conductive structure has a conductive pattern and positive ions, wherein the conductive pattern is made of a conductive paste, the conductive pattern comprises conductive particles and a resin, the positive ions are attached to the resin among the conductive particles.

Optionally, the positive ions are metal cations and/or hydrogen ions.

Optionally, the metal cations are selected from one or more of sodium ion, lithium ion, or potassium ion.

Optionally, a number of positive ions in each area of the conductive structure is consistent.

Optionally, in the first direction, conductive structure is divided into a plurality of areas in a first direction, and a number of positive ions in one area of the plurality of areas is different from a number of positive ions in another area of the plurality of areas that is adjacent to the one area along the first direction.

In a second aspect, the present disclosure provides a method of manufacturing an electronic device adopting the following technical solutions:

A method of making the electronic device comprises:

providing a substrate;

forming a conductive pattern on the substrate with a conductive paste comprising conductive particles and a resin;

drying the conductive pattern at room temperature;

contacting the conductive pattern after the drying with positive ions, such that the positive ions are attached to the resin among the conductive particles to obtain a conductive structure.

Alternatively, the conductive structure is obtained by contacting the conductive pattern after the drying with a liquid containing positive ions, then rinsing the conductive pattern clean, and after the rinsing, the positive ions being attached to the resin among the conductive particles.

Alternatively, the liquid containing the positive ions is an acid solution, a base solution, or a salt solution.

Optionally, the contacting includes one or more of immersing, spraying, dripping or coating.

In a third aspect, the present disclosure provides a method of manufacturing an electronic device adopting the following technical solutions:

A method for manufacturing an electronic device comprises:

providing a substrate;

forming a conductive pattern on the substrate with a conductive paste comprising conductive particles and a resin;

drying the conductive pattern by heating;

contacting the conductive pattern after drying with positive ions, such that the positive ions are attached to the resin among the conductive particles to obtain a conductive structure.

The present disclosure provides an electronic device comprises a substrate and a conductive structure provided on the substrate, and the conductive structure has a conductive pattern and positive ions, wherein the conductive pattern is made of a conductive paste, the conductive pattern comprises conductive particles and a resin, the positive ions are attached to the resin among the conductive particles. In the above conductive structure, the addition of the positive ions increases the amount of holes throughout the system of the conductive structure, and reduces the difficulty of electrons passing through the resin among the conductive particles. The electrons can be transferred from the conductive particles to the positive ions and then transferred from the positive ions to adjacent conductive particles, thereby improving the electrical performance of the conductive structure, and further enabling the resistance of the conductive structure to cure to be independent of the drying and curing process without changing the current conductive paste material system.

BRIEF DESCRIPTION OF DRAWINGS

In order to more clearly illustrate the technical solutions in embodiments of the present disclosure or the related art, the accompanying drawings used in the description of the embodiments or the related art will be briefly introduced below. It is apparent that, the accompanying drawings in the following description are only some embodiments of the present disclosure, and other drawings can be obtained by those of ordinary skill in the art from the provided drawings without creative efforts.

Figure 1:
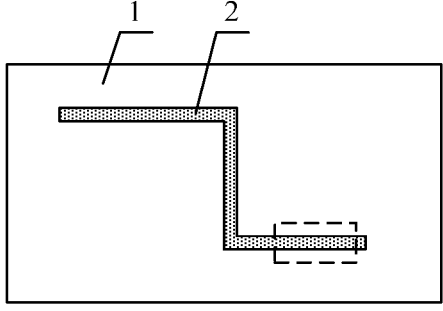

FIG. 1 is a first schematic structural view showing an electronic device according to an embodiment of the disclosure.

Figure 2:
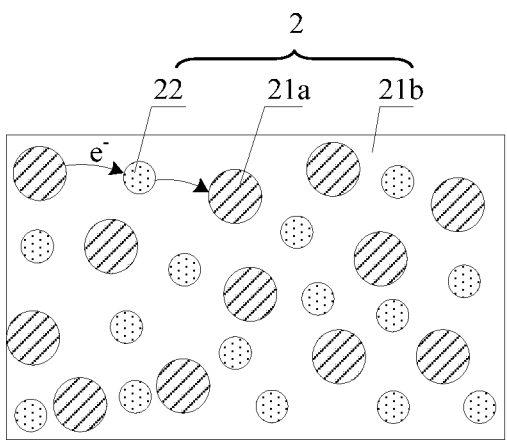

FIG. 2 is a schematic view of a microstructure of area A of FIG. 1 according to an embodiment of the present disclosure.

Figure 3:
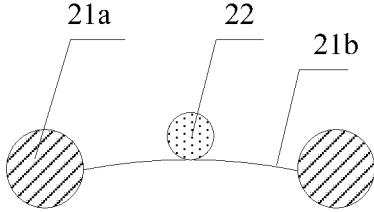

FIG. 3 is a first schematic view showing position of positive ions according to an embodiment of the present disclosure.

Figure 4:
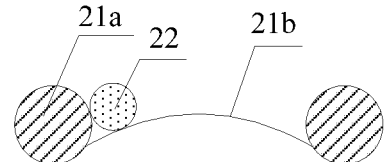

FIG. 4 is a second view showing position of positive ions according to an embodiment of the present disclosure.

Figure 5:
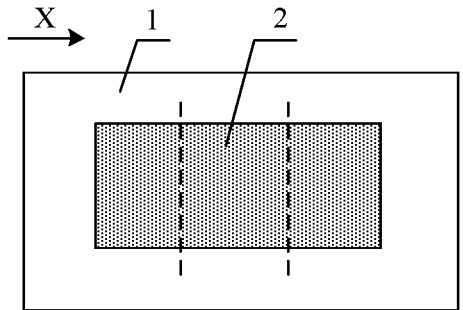

FIG. 5 is a second schematic structural view showing an electronic device according to an embodiment of the disclosure.

Figure 6:
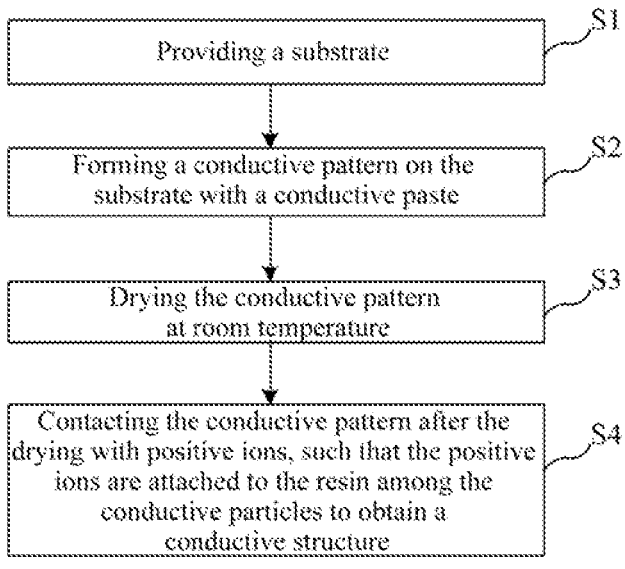

FIG. 6 is a flow chart showing a method for manufacturing an electronic device according to an embodiment of the disclosure.

Figure 7:
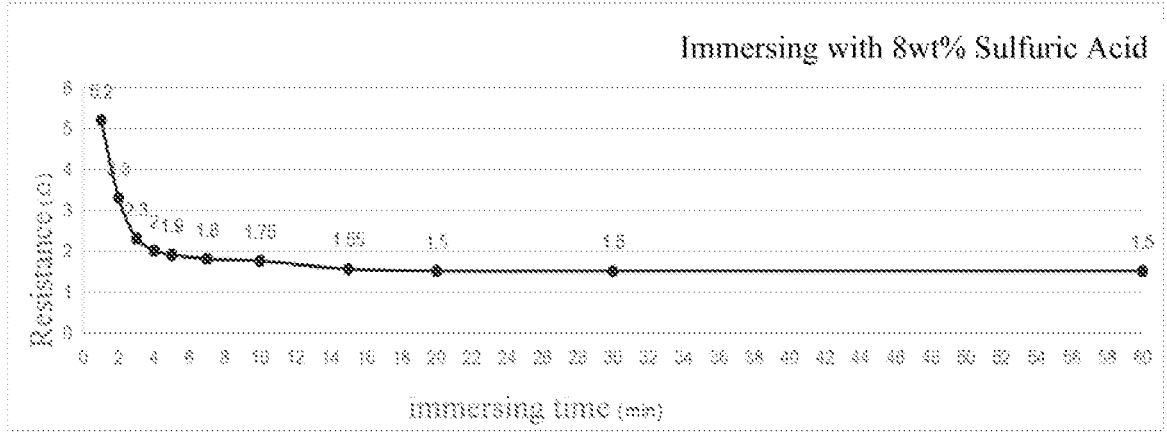

FIG. 7 is a view of resistance trend as a function of the time for contacting positive ions according to an embodiment of the present disclosure.

Figure 8:
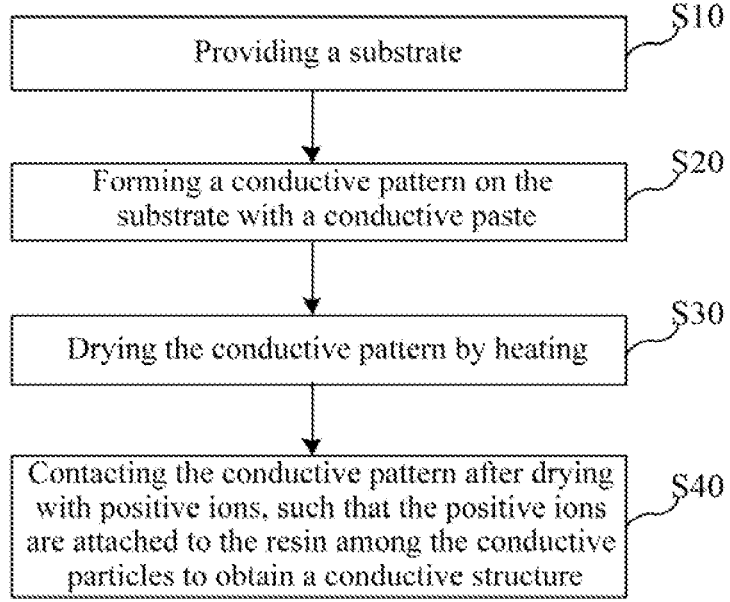

FIG. 8 is a second flow chart showing a method for manufacturing an electronic device according to an embodiment of the disclosure.

DESCRIPTION OF EMBODIMENTS

In order to make the objectives, technical solutions and advantages of the embodiments of the present disclosure clearer, the technical solutions in the embodiments of the present invention will be described clearly and completely below with reference to the accompanying drawings in the embodiments of the present disclosure. Apparently, the described embodiments are merely some of rather than all of the embodiments of the present disclosure. All other embodiments acquired by those skilled in the art without creative efforts based on the embodiments of the present disclosure shall fall within the protection scope of the present disclosure.

It is to be noted that technical features in the embodiments of the present disclosure may be combined with each other without conflict.

In an embodiment of the present disclosure, an electronic device is provided, in particular, as shown in FIGS. 1 and 2, FIG. 1 is a schematic structural view of the electronic device provided by the embodiment of the present disclosure, and FIG. 2 is a schematic structural view of the area A of FIG. 1 provided by the embodiment of the present disclosure, and the electronic device comprises:

a substrate 1 and a conductive structures 2 disposed on the substrate 1, and the conductive structures 2 include a conductive pattern 21 made of a conductive paste including conductive particles 21*a* and a resin 21*b*, and positive ions 22 are attached to the resin 21*b* among the conductive particles 21*a*.

The manners in which the positive ions 22 are attached to the resin 21*b* among the conductive particles 21*a* may be varied, for example, as shown in FIG. 3, which is a schematic view showing the position of the positive ions provided by the embodiment of the present disclosure, the positive ions 22 are attached to the surface of the resin 21*b*, or as shown in FIG. 4, which is a second schematic view showing the position of the positive ions 22 provided by the embodiment of the present disclosure, the positive ions 22 are embedded in the gap between the conductive particles 21*a* and the resin 21*b*, or other manners, which is not limited herein. In addition, the positive ions 22 may also attached to the conductive particles 21*a*, and the more positive ions 22 are attached to the conductive pattern 21, the better electrical performance of the conductive structure 2 will be.

The principle of increasing the electrical performance of the conductive structure 2 by the presence of the positive ions 22 is as follows: the addition of the positive ions 22 increases the number of holes throughout the conductive structure 2 and reduces the difficulty of electrons passing through the resin 21*b* among the conductive particles 21*a*, as shown in FIG. 2, and electrons can be transferred from the conductive particles 21*a* to the positive ions 22 and then transferred from the positive ions 22 to adjacent conductive particles 21*b*, thereby increasing the conductivity of the conductive structure 2, and making the resistance of the conductive structure independent of the drying and curing process.

It should be noted that the sizes and the positions of the conductive particles 21*a* and the positive ions 22 shown in FIG. 2 are only examples and are not meant to be limiting. The conductive particles 21*a* may be in contact with each other, the conductive patterns 21 may have a plurality of paths, such as paths formed by connecting the conductive particles 21*a*, paths formed by conductive particles via the resin 21*b*, paths formed by the conductive particles 21*a* via the resin 21*b* and the positive ions 22 thereon, paths formed by the conductive particles 21*a* via the positive ions 22, etc.

Parts of the above electronic device will be described in detail in Embodiments of the present disclosure.

Optionally, the substrate 1 may be a flexible substrate, such as one of polyethylene terephthalate (PET), polybutylene terephthalate (PBT), polyethylene naphthalate (PEN), polyimide (PI), polyamide (PA), low density polyethylene (LDPE), thermoplastic elastomer (TPE), thermoplastic polyurethane elastomer (TPU), or the like, or a rigid substrate, such as FR-4, epoxy glass, glass resin, or the like. The advantages of embodiments of the present disclosure are more apparent in non-temperature resistant substrates, such as low density polyethylene (LDPE), thermoplastic elastomer (TPE), thermoplastic polyurethane elastomer rubber (TPU), etc.

Optionally, the positive ions in the embodiments of the present disclosure are strong positive ions, such as metal cations and/or hydrogen ions, which enhance the electrical performance. For example, the metal cations are one or more of sodium ions, lithium ions, or potassium ions.

Optionally, the conductive structures 2 in the embodiments may be conductive wiring, conductive layers, conductive connectors, resistors, etc., which is not limited in the present embodiment. In addition, the resistance among different areas of the conductive structure 2 may be consistent or different, and in particular may be designed according to actual needs, and control of the resistance is achieved by controlling the number of positive ions at different locations of the conductive structure 2 in the present embodiment.

In one example, as shown in FIG. 1, the conductive structure 2 is an integral structure, and the number of positive ions in each area of the conductive structure 2 is consistent, such that the integral resistance of the conductive structure 2 is consistent. The conductive structures 2 in this example may be conductive wiring or the like.

In another example, as shown in FIG. 5, which is a second schematic structural view of an electronic device according to an embodiment of the present disclosure, in a first direction X, the conductive structure 2 is divided into a plurality of areas (separated by dashed lines in FIG. 5), and the number of positive ions in two adjacent areas of the conductive structure 2 along the first direction X is different, that is, the resistance of the two adjacent areas is different. The number of positive ions in each area along the first direction X can be gradually increased, or gradually decreased, or varied with high and low fluctuation, and can be selected according to actual needs. The first direction X may be a direction parallel to the edge of the substrate or may be a direction that forms an angle to the edge of the substrate. The conductive structure in this embodiment may be a step resistor or the like.

Optionally, the conductive paste used to make the conductive pattern in the embodiments of the present disclosure may include the following components in weight percentage: 30% to 95% of conductive fillers, 5% to 70% of organic resin carriers, and 0% to 5% of aids. The weight percentage of the conductive filler may be 30%, 35%, 40%, 45%, 50%, 55%, 60%, 65%, 70%, 75%, 80%, 85%, 90%, or 95%; the weight percentage of the organic resin carrier may be 5%, 10%, 15%, 20%, 25%, 30%, 35%, 40%, 45%, 50%, 55%, 60%, 65%, or 70%; and the weight percentage of the aids may be 0, 0.1%, 0.2%, 0.5%, 1%, 1.5%, 2%, 2.5%, 3%, 3.5%, 4%, 4.5%, or 5%.

For example, the conductive filler, the organic resin carrier, and the aids in the conductive paste in the embodiments of the present disclosure may be selected with reference to the following.

Conductive Fillers

In an embodiment of the present disclosure, the conductive filler is one of gold, silver, copper, iron, nickel, aluminum, graphene, carbon black, graphite, silver coating copper powder, and the like or a combination thereof. The conductive filler is one of flake shape, sphere shape, wire shape, rod shape, needle shape, dendritic shape, and the like. Preferably, the conductive filler is silver powder, and in particular may be spherical silver powder, flake silver powder, or a mixture thereof.

Organic Resin Carrier

The organic resin carrier in an embodiment of the present disclosure comprises a resin (either a thermoplastic resin or a thermosetting resin), and optionally comprises a solvent, a curing agent, and the like.

The resin in embodiments herein may be one or a mixture of two of the following: a polyester resin, a polyurethane resin, an epoxy resin, an acrylic resin, a phenolic resin, an alkyd resin, a silicone resin, a chlorovinegar resin, a polyimide resin.

In embodiments of the present disclosure, the solvent is one of ethanol, isopropanol, n-propanol, ethylene glycol, propylene glycol, glycerol, n-butanol, ethylene glycol propyl ether, ethylene glycol butyl ether, diethylene glycol ethyl ether, diethylene glycol propyl ether, diethylene glycol butyl ether, propylene glycol propyl ether, propylene glycol butyl ether, dipropylene glycol ethyl ether, dipropylene glycol propyl ether, and dipropylene glycol propyl ether. Propylene glycol butyl ether, ethylene glycol propyl ether acetate, ethylene glycol butyl ether acetate, diethylene glycol ethyl ether acetate, diethylene glycol propyl ether acetate, diethylene glycol butyl ether acetate, propylene glycol propyl ether acetate, propylene glycol butyl ether acetate, dipropylene glycol ethyl ether acetate, dipropylene glycol propyl ether acetate, dipropylene glycol butyl ether acetate, isophorone and terpineol, or a combination thereof.

The curing agents in embodiments of the present disclosure may be one or more of an isocyanate curing agent, a phenolic curing agent, or an amine curing agent.

Aids

In embodiments herein, the aids may be one or more of a wetting agent, a dispersing agent, an adhesion promoter, a coupling agent, a leveling agent, a thixotropic agent, an antioxidant, a defoaming agent, an acid-base balancing agent, and the like.

The electronic devices in the embodiments of the disclosure may be manufactured through multiple methods, and the embodiments of the disclosure are described in terms of two specific manufacturing methods.

For example, as shown in FIG. 6, which is a first flow chart of a method for manufacturing an electronic device according to an embodiment of the disclosure, a first method for manufacturing an electronic device according to an embodiment of the disclosure comprises:

S1, providing a substrate;

S2, forming a conductive pattern on the substrate with a conductive paste including conductive particles and a resin;

In embodiments of the present disclosure, a conductive paste may be used to make a conductive pattern on a substrate through screen printing, steel mesh printing, flexographic printing, pad printing, transfer printing, extrusion dispensing, coating, and other molding processes.

S3: drying the conductive pattern at room temperature.

The degree of drying can be achieved as long as the surface layer of the conductive pattern is solvent-free, that is because, if a solvent is present, the presence of the solvent prevents the attachment of positive ions in the next step due to the fact that the substance capable of ionizing positive ions is readily soluble in water, and is insoluble in the solvent. The degree of drying of the conductive pattern can be either surface drying or overall drying, which is not limited herein.

Taking a standard conductive pattern with a length of 180 mm, a width of 0.8 mm, and a thickness of 20 μm as an example, after step S3, the resistance is mainly among several ohms to infinity (non-conductive), which is related to the type of conductive paste and the time for drying.

In S4, the dried conductive pattern is contacted with positive ions attached to the resin among the conductive particles to obtain a conductive structure.

Optionally, in embodiments of the present disclosure, the conductive structure is obtained by contacting the dried conductive pattern with a liquid containing positive ions, then rinsing the conductive pattern clean, after the rinsing, the positive ions being attached to the resin among the conductive particles.

Optionally, the liquid containing the positive ion is an acid solution, a base solution, or a salt solution.

Optionally, the contacting includes one or more of immersing, spraying, dripping, or coating. As shown in FIG. 7, which is a view of resistance trend as a function of the time for contacting positive ions according to an embodiment of the present disclosure, the applicant has found that upon initial contact, resistance decreases rapidly, and as time passes, resistance decreases gradually until resistance reaches a steady state. That is, in a certain period of time, the longer the time for contacting is, the more significant the resistance decreases. In addition, the higher the concentration of positive ions in the liquid containing positive ions is, the more significant the resistance decrease under the condition that the time for contacting is the same. A person skilled in the art can select the concentration of the liquid and the time for contacting according to actual needs.

For example, the time for contacting in this embodiment may be 30 s to 30 min. The acid solution may be a sulfuric acid solution or a hydrochloric acid solution with a concentration of 1% to 10%, the base solution may be a sodium hydroxide solution or a potassium hydroxide solution with a concentration of 1% to 10%, and the salt solution may be a sodium chloride solution or a potassium chloride solution with a concentration of 1% to 10%.

The resistance of the conductive structure obtained after S4 is significantly reduced from step S3 by 50% or more, or even 99% or more.

In one embodiment, when the conductive structure 2 as shown in FIG. 1 is formed, in S4, the entire conductive pattern after drying may be completely immersed in the liquid containing positive ions, or the areas may be immersed in the liquid containing positive ions for the same time.

In another embodiment, when manufacturing the conductive structure 2 as shown in FIG. 5, in S4, the drying of the areas of the conductive pattern may be performed by immersing the areas of the conductive pattern after drying into the liquid containing positive ions for different times. Specifically, the areas may be immersed for different times, or the areas may be immersed in the liquid as a whole, and then, in stages, removed from the liquid sequentially, or the areas may, in stages, enter in the liquid sequentially, and then be immersed in the liquid as a whole.

In the manufacturing process of the above electronic device, when the conductive pattern is made by printing the conductive paste, then the conductive pattern is exposed to the environment containing the positive ions, the positive ions are attached to the resin among the conductive particles, and the conductivity of the conductive structure can be improved, thereby enabling the conductive structure to be formed by a low temperature or zero thermal process without changing the current conductive paste material system, such that the electrical properties of the conductive structure do not rely on the drying and curing process.

Manufacturing method of the above electronic devices are suitable for not only conventional temperature resistant substrates, which can be dried by heating for curing, but also the non-temperature resistant substrates, such as low density polyethylene (LDPE), thermoplastic elastomers (TPE), thermoplastic polyurethane elastomer rubbers (TPU), etc.

Referring to FIG. 8, which is a second flow chart of a method for manufacturing an electronic device according to an embodiment of the disclosure, a second manufacturing method for manufacturing an electronic device according to an embodiment of the disclosure comprises:

S10, providing a substrate;

S20, forming a conductive pattern on a substrate with a conductive paste including conductive particles and a resin;

In embodiments of the present disclosure, a conductive paste may be used to make a conductive pattern on a substrate through screen printing, steel mesh printing, flexographic printing, pad printing, transfer printing, extrusion dispensing, coating, and other molding processes.

S30, drying the conductive pattern by heating;

The temperature for drying may be 120° C. to 200° C., and the sintering time may be 10 min to 80 min. Taking a standard conductive pattern with a length of 180 mm, a width of 0.8 mm, and a thickness of 20 μm as an example, the resistance after S30 is mainly in the range of a few tenths of ohms to a few ohms.

In S40, the conductive pattern after drying is contacted with positive ions attached to the resin among the conductive particles after heating, and a conductive structure is obtained.

Optionally, in the present embodiment, the conductive structure is obtained by contacting the conductive pattern after the drying with a liquid containing positive ions, then rinsing the conductive pattern clean, and the positive ions being attached to the resin among the conductive particles.

Optionally, the liquid containing the positive ion is an acid solution, a base solution, or a salt solution.

Optionally, the contacting includes one or more of immersing, spraying, dripping, or coating. The longer the time for contacting is, the more significant the resistance decreases. The higher the concentration of positive ions in the liquid containing positive ions is, the more significant the resistance decreases under the condition that the time for contacting is the same. A person skilled in the art can select the concentration of the liquid and the time for contacting according to actual needs.

For example, the time for contacting in this embodiment may be 30 s to 30 min. The acid solution may be a sulfuric acid solution or a hydrochloric acid solution with a concentration of 1% to 10%, the base solution may be a sodium hydroxide solution or a potassium hydroxide solution with a concentration of 1% to 10%, and the salt solution may be a sodium chloride solution or a potassium chloride solution with a concentration of 1% to 10%.

The resistance of the conductive structure obtained after the S40 is significantly reduced from the step S30 by a 10% or more, or even 50% or so.

In one embodiment, when the conductive structure 2 as shown in FIG. 1 is formed, in S40, the entire conductive pattern after drying may be completely immersed in the liquid containing positive ions, or the areas may be immersed in the liquid containing positive ions for the same time.

In another example, when manufacturing the conductive structure 2 as shown in FIG. 5, in S4, the drying of the areas of the conductive pattern may be performed by immersing the areas of the conductive pattern after drying into the liquid containing positive ions for different times. Specifically, the areas may be immersed for different times, or the areas may be immersed in the liquid as a whole, and then, in stages, removed from the liquid sequentially, or the areas may, in stages, enter in the liquid sequentially, and then be immersed in the liquid as a whole.

It should be noted that the initial resistance of the conductive pattern during the S4 of the first manufacturing method is high and the magnitude of the decrease in resistance is higher than that of the second manufacturing method.

The details of the electronic device in the embodiments of the present disclosure are applicable to both manufacturing methods and are not repeated herein.

Embodiments

Embodiments 1-39 illustrate the comparison of the resistance change before and after S4 in the first manufacturing method of the electronic device. The conductive patterns were all standard conductive patterns with a length of 180 mm, a width of 0.8 mm, and a thickness of 20 μm. The processing time of S4 is 30 min.

| Embod-iment | Liquid containing positive ions | Resistance before S4 | Resistance after S4 | Resistance Change Value (Ohms) | Resistance Rate of Change |
|---|---|---|---|---|---|
| 1 | 8 wt % of Sulfuric Acid | 176 | 12.1 | 163.9 | 93.1% |
| 2 | 8 wt % of Sulfuric Acid | 4800 | 10.9 | 4789.1 | 99.8 |
| 3 | 8 wt % of Sulfuric Acid | 360 | 11.5 | 348.5 | 96.8 |
| 4 | 8 wt % of Sulfuric Acid | 45.3 | 10.1 | 35.2 | 77.7% |
| 5 | 8 wt % of Sulfuric Acid | 285 | 16.4 | 268.6 | 94.2% |
| 6 | 8 wt % of Sulfuric Acid | 83 | 6.8 | 76.2 | 91.8 |
| 7 | 8 wt % of Sulfuric Acid | 280 | 11.1 | 268.9 | 96.0% |
| 8 | 8 wt % of Sulfuric Acid | 64 | 11.1 | 52.9 | 82.7% |
| 9 | 8 wt % of Sulfuric Acid | 23.2 | 7.8 | 15.4 | 66.4% |
| 10 | 8 wt % of Sulfuric Acid | 124 | 7.1 | 116.9 | 94.3% |
| 11 | 8 wt % of Sulfuric Acid | 75.6 | 8.4 | 67.2 | 88.9% |
| 12 | 8 wt % of Sulfuric Acid | 30.6 | 9.9 | 20.7 | 67.6% |
| 13 | 8 wt % of Sulfuric Acid | 14 | 6.8 | 7.2 | 51.4% |
| 14 | 8 wt % of Sulfuric Acid | 150 | 7.6 | 142.4 | 94.9% |
| 15 | 8 wt % of Sulfuric Acid | 32 | 8.6 | 23.4 | 73.1% |
| 16 | 8 wt % of Sulfuric Acid | 168 | 4.6 | 163.4 | 97.3% |
| 17 | 8 wt % of Sulfuric Acid | 186 | 11.8 | 174.2 | 93.7% |
| 18 | 8 wt % of Sulfuric Acid | 34.1 | 1.5 | 32.6 | 95.6% |
| 19 | 8 wt % of Sulfuric Acid | Infinite | 11 | / | >99% |
| 20 | 8 wt % of Sulfuric Acid | Infinite | 27.8 | / | >99% |
| 21 | 8 wt % of Sulfuric Acid | Infinite | 190 | / | >99% |
| 22 | 8 wt % of Sulfuric Acid | Infinite | 5.3 | / | >99% |
| 23 | 8 wt % of Sulfuric Acid | Infinite | 11.7 | / | >99% |
| 24 | 8 wt % of Sulfuric Acid | 48.1 | 2.3 | 45.8 | 95.2% |
| 25 | 8 wt % of Sulfuric Acid | Infinite | 6.6 | / | >99% |
| 26 | 8 wt % of Sulfuric Acid | 19.2 | 1.7 | 17.5 | 91.1% |
| 27 | 8 wt % of Sulfuric Acid | Infinite | 2.7 | / | >99% |
| 28 | 8 wt % of Sulfuric Acid | 11.5 | 3 | 8.5 | 73.9% |
| 29 | 8 wt % of Sulfuric Acid | 1760 | 7.2 | 1752.8 | 99.6% |
| 30 | 8 wt % of Sulfuric Acid | Infinite | 6.2 | / | >99% |
| 31 | 8 wt % of Sulfuric Acid | 81 | 1.5 | 79.5 | 98.1% |
| 32 | 8 wt % of Sulfuric Acid | Infinite | 5.6 | / | >99% |
| 33 | 8 wt % of Sulfuric Acid | 64.6 | 28.5 | 36.1 | 55.9% |
| 34 | 8 wt % of Sulfuric Acid | Infinite | 4.3 | / | >99% |
| 35 | 8 wt % of Sulfuric Acid | Infinite | 2.7 | / | >99% |
| 36 | 10 wt % of Sulfuric Acid | 18.8 | 3.8 | 15 | 79.8% |
| 37 | 10 wt % NaOH | 11.5 | 3.6 | 7.9 | 68.7% |

-continued

| Embod-iment | Liquid containing positive ions | Resistance before S4 | Resistance after S4 | Resistance Change Value (Ohms) | Resistance Rate of Change |
|---|---|---|---|---|---|
| 38 | 10 wt % NaCl | 17.7 | 3.2 | 14.5 | 81.9% |
| 39 | 10 wt % LiCl | 16.8 | 2.9 | 13.9 | 82.7% |

In embodiments 40 to 53, the resistance variation before and after S40 is compared in the second manufacturing method of the electronic device. The conductive patterns were all standard conductive patterns with a length of 180 mm, a width of 0.8 mm, and a thickness of 20 μm. The processing time of S40 is 30 min.

| Embod-iment | Liquid containing positive ions | Resistor before step S4 | Resistor after step S4 | Resistance Change Value (Ohms) | Resistance Rate of Change |
|---|---|---|---|---|---|
| 40 | 8 wt % of Sulfuric Acid | 1.2 | 0.9 | 0.3 | 25% |
| 41 | 8 wt % of Sulfuric Acid | 1.3 | 0.8 | 0.5 | 38.5% |
| 42 | 8 wt % of Sulfuric Acid | 1.1 | 0.8 | 0.3 | 27.3% |
| 43 | 8 wt % of Sulfuric Acid | 1.5 | 0.9 | 0.6 | 40% |
| 44 | 8 wt % of Sulfuric Acid | 2.7 | 2 | 0.7 | 25.9% |
| 45 | 8 wt % of Sulfuric Acid | 0.9 | 0.5 | 0.4 | 44.4% |
| 46 | 8 wt % of Sulfuric Acid | 16.1 | 10.2 | 5.9 | 36.6% |
| 47 | 8 wt % of Sulfuric Acid | 11.9 | 10.1 | 1.8 | 15.1% |
| 48 | 8 wt % of Sulfuric Acid | 12.8 | 10.4 | 2.4 | 18.8% |
| 49 | 8 wt % of Sulfuric Acid | 10.2 | 8.0 | 2.2 | 21.6% |
| 50 | 8 wt % of Sulfuric Acid | 17.1 | 8.8 | 8.3 | 48.5% |
| 51 | 8 wt % of Sulfuric Acid | 12.4 | 9.5 | 2.9 | 23.4% |
| 52 | 8 wt % of Sulfuric Acid | 10.5 | 9.4 | 1.1 | 10.5% |
| 53 | 8 wt % of Sulfuric Acid | 9.6 | 8 | 1.6 | 16.7% |

Finally, it should be noted that the technical solutions of the present disclosure are illustrated by the above embodiments, but not intended to limit thereto. Although the present disclosure has been described in detail with reference to the foregoing embodiments, those skilled in the art will understand that the present disclosure is not limited to the specific embodiments described herein, and various obvious modifications, readjustments, and substitutions can be derived without departing from the scope of the present disclosure.

The invention claimed is:

1. An electronic device, comprising:
a substrate, and a conductive structure provided on the substrate, wherein the conductive structure has a conductive pattern and positive ions, wherein the conductive pattern is made of a conductive paste, the conductive pattern comprises conductive particles and a resin, the positive ions are attached to the resin among the conductive particles; and
wherein the conductive structure is divided into a plurality of areas in a first direction, and a number of the positive ions in adjacent areas of the conductive structure along the first direction is gradually increased or decreased, in such a manner that the conductive structure is a step resistor.

2. The electronic device according to claim 1, wherein the positive ions are metal cations and/or hydrogen ions.

3. The electronic device according to claim 2, wherein the metal cations are one or more of sodium ion, lithium ion, or potassium ion.

* * * * *